(12) United States Patent
Hinz

(10) Patent No.: US 8,046,530 B2
(45) Date of Patent: Oct. 25, 2011

(54) PROCESS AND METHOD FOR ERASE STRATEGY IN SOLID STATE DISKS

(75) Inventor: Torsten Hinz, Augsburg (DE)

(73) Assignee: Infineon Technologies AG, Neubiberg (DE)

( * ) Notice: Subject to any disclaimer, the term of this patent is extended or adjusted under 35 U.S.C. 154(b) by 634 days.

(21) Appl. No.: 12/244,587

(22) Filed: Oct. 2, 2008

(65) Prior Publication Data
US 2010/0088482 A1    Apr. 8, 2010

(51) Int. Cl.
*G06F 13/00* (2006.01)
(52) U.S. Cl. ........ 711/103; 711/154; 711/161; 711/162; 711/165
(58) Field of Classification Search .......... 711/103, 711/154, 161, 162, 165
See application file for complete search history.

(56) References Cited

U.S. PATENT DOCUMENTS
2003/0041210 A1 *  2/2003  Keays ............ 711/103
* cited by examiner

*Primary Examiner* — Jae Yu
(74) *Attorney, Agent, or Firm* — Slater & Matsil, L.L.P.

(57) ABSTRACT

An embodiment of the invention relates to a nonvolatile mass storage device such as a flash memory device formed with erase blocks partitioned into memory management blocks. An erase block is identified containing at least a minimum number of management blocks marked invalid, from which data is copied, merged, and stored in a new management block. The erase block is then erased. Erase blocks containing at least the minimum number of invalid management blocks may be erased until a minimum amount of management blocks is free. Alternatively, all erase blocks containing at least the minimum number of invalid management blocks may be erased. A management table listing the number of invalid management blocks in erase blocks may be included in the mass storage device. Preferably, the new management block for storage of the merged data is located in an erase block different from the identified erase block.

18 Claims, 2 Drawing Sheets

PROCESS AND METHOD FOR ERASE STRATEGY IN SOLID STATE DISKS

TECHNICAL FIELD

An embodiment of the invention relates generally to mass storage devices and methods, and more particularly to an erase strategy for erase blocks in a flash memory device.

BACKGROUND

Mass storage memory devices such as flash cards, USB ("universal serial bus") sticks, or solid-state disks use flash semiconductor structures to store data in a nonvolatile memory device. A nonvolatile memory device refers to a memory device for which a power source can be switched "off" without losing the contents of the memory. Nonvolatile memory devices include flash memory devices that may semi-permanently retain an electric charge to represent one or more bits, or a "hard disk" (also referred to as a "hard drive") that may a semi-permanently retain a magnetic charge to store one or more bits. Semiconductor devices such as SRAMs (static random access memories) and DRAMs (dynamic random access memories) are referred to as volatile memory devices because they lose the contents of their memories if a bias voltage source is switched off.

Today's magnetic-based mass storage devices such as floppy disks or hard disks are organized in so-called sectors (a sector of being a portion of a "track" in the disk), each sector typically storing 512 bytes (in magnetic disks), and each sector identified with an individual logical block address (LBA). An LBA is a logical addressing scheme wherein a fixed one-to-one relationship is established between a sector of data and the physical location on the disk in which the respective sector of data is stored. The operating system of a computer collectively handles the LBAs of the mass storage device and builds a file system based thereon. The computer operating system reads and writes sequential amounts of LBAs with different block sizes from and to the mass storage device. In a hard disk, data can be freely written, read, or rewritten one or more sectors at a time.

Unlike magnetic memory devices, in flash memory devices there are restrictions regarding reading and writing of data. Flash memory devices are organized in pages, typically of size 4 kB (kilobytes) plus data protection headroom, and in erase blocks (also referred to herein as a "block"), for example, an erase block of size 64 pages. Accordingly, a 4 kB page of flash memory can store eight 512-byte sectors. A page of flash memory that is not programmed, i.e., a page that does not already contain data, can be written only as an entire page. Similarly, data can be read one page at a time. Flash memory has a further restriction in that it can be erased only a block at a time. Thus, to rewrite selected data in a portion of memory, an entire block must be read, erased, the new data merged with the previous data, and the merged data rewritten as a block, i.e., a copy and merge operation must be performed. Data can thus not be overwritten except as an entire block.

Writing and rewriting is generally referred to as programming. In a typical (NAND structured) flash memory, a page is written to all 1's to erase previously stored data, and can then be rewritten with the intended data. A block of data in a flash memory device is typically written to a different physical portion of the flash memory device to alleviate a wear-out problem associated with repetitively storing data in the same memory location. A translation (mapping) table stored in nonvolatile memory of the flash memory device is thus required in the communication link with a host computer to logically associate a sector of data with its physical location. A translation table is also generally moved each time it is rewritten. The restrictions of reading, writing, and rewriting in a flash memory device are also applicable to the translation table stored therein.

To execute a copy and merge operation, non-programmed blocks of memory must be available. Therefore, after several copy and merge operations, there are erase operations that are necessary to maintain availability of empty blocks for further erase operations.

In the ordinary operation of a flash memory device, i.e., a solid-state disk ("SSD"), coupled to a host computer, there are typically small amounts of new data that are required to be copied and merged with old data stored in an erase block. The merged data is stored in a new flash memory location. This results in a substantial amount of data that must be copied and merged for a small amount of new data to be stored due to do need to copy and merge all the unchanged data originally stored in the erase block.

A conventional way of handling free blocks of memory in a USB flash memory stick is the use of so-called log blocks. A log block provides a temporary area of memory (i.e., a previously erased erase block) to consecutively accumulate merged data, with appropriate updates to the mapping table. After valid data in an erase block are merged to a log block, the previous erase block location is identified as invalid and can be erased, making it available for another erase-block merging operation. This procedure is continued until all sectors of the log block are filled. When a log block is full, a new log block can be started. A garbage collection process refers to erasing erase blocks that contain invalid data to free the erase block up for reuse.

The disadvantage of this procedure is that a huge amount of data is typically copied before a single (invalid) block can be erased. For an USB memory stick where normally large amounts of consecutive sectors are written, this procedure provides reasonably satisfactory performance, since sectors are stored consecutively in the log block. But for an SSD with frequent random writes of small amounts of data, this procedure results in substantial inefficiency for erase operations.

Due to limitations of writing new data to flash memory devices using conventional procedures as described above wherein a large amount of data must be copied and merged for each write access before a single block can be erased, a more efficient solution for managing storage of new data in such devices is required. Thus, there is a need for a process and related method for an efficient erase operation that is necessary to be performed for storage of new data in the nonvolatile memory of a flash memory device that avoids the inefficiencies of conventional processes.

SUMMARY OF THE INVENTION

In accordance with an exemplary embodiment, a mass storage device and a related method are provided. In an embodiment, the mass storage device is constructed with a nonvolatile memory device such as a flash memory device, wherein the nonvolatile memory device includes a plurality of erase blocks, and each erase block is formed with memory management blocks. A controller is coupled to the nonvolatile memory device. In an embodiment, the controller is configured to identify an erase block in the nonvolatile memory device containing at least a number k of management blocks marked invalid, to copy and merge data from the erase block containing at least the number k of management blocks marked invalid, to store the merged data in a new management block, and to erase the erase block containing at least the number k of management blocks marked invalid. Preferably, the number k is greater than zero. In an embodiment, the controller is further configured to erase additional erase blocks containing at least the number k of management blocks marked invalid until an amount of management blocks in the erase blocks in the mass storage device is free. In an embodiment, the controller is further configured to erase all erase blocks in the mass storage device containing at least the number k of management blocks marked invalid. In an embodiment, the controller is further configured to limit identification of the erase block containing at least the number k of management blocks marked invalid to the erase block or blocks in the mass storage device containing the largest number of management blocks marked invalid. The controller may include a management table listing the number of invalid management blocks in erase blocks in the mass storage device. The management table may be stored in a volatile memory device coupled to the controller. Preferably, the new management block for storage of the merged data is located in an erase block different from the identified erase block.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be redescribed in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a mass storage device wherein data is erased in blocks to enable storage of new data.

An embodiment of the invention may be applied to a mass storage device, for example, to a solid-state drive formed with a flash memory device. Other mass storage devices can be constructed that include a memory device wherein data is erased in blocks to enable storage of new data as introduced herein in different contexts using inventive concepts described herein, for example, a solid-state memory stick for a digital camera.

Using processes and methods as introduced herein, the amount of data in a solid-state disk to be copied and merged out of an erase block to produce an entirely invalid erase block for an erase operation is reduced. The relationship between the amount of management blocks to be copied and merged and of management blocks rendered free with an erase operation is highly improved. The term "management block" as used herein refers to a group of pages of memory as described further hereinbelow. An erase block is formed as a sequence of management blocks.

As introduced herein, a well-balanced amount of used, free, and invalid blocks is maintained, and an approach dependent on a number of invalid management blocks in an erase block is employed for deciding which erase blocks will be chosen for an erase operation. In an embodiment, an erase operation is performed on erase blocks containing the most invalid management blocks in a memory device until a fixed amount of management blocks in the erase blocks is free. In a further embodiment, an erase operation is performed on erase blocks in a memory device until all erase blocks containing a number k or larger of invalid management blocks have been copied and merged and then erased. In a further embodiment, a combination of these erase operations is performed. Thus, those erase blocks with the most invalid management blocks are copied and erased. Preferably, the erase operation is performed in the background when data is not being actively stored into or read from the memory device.

Figure 1:
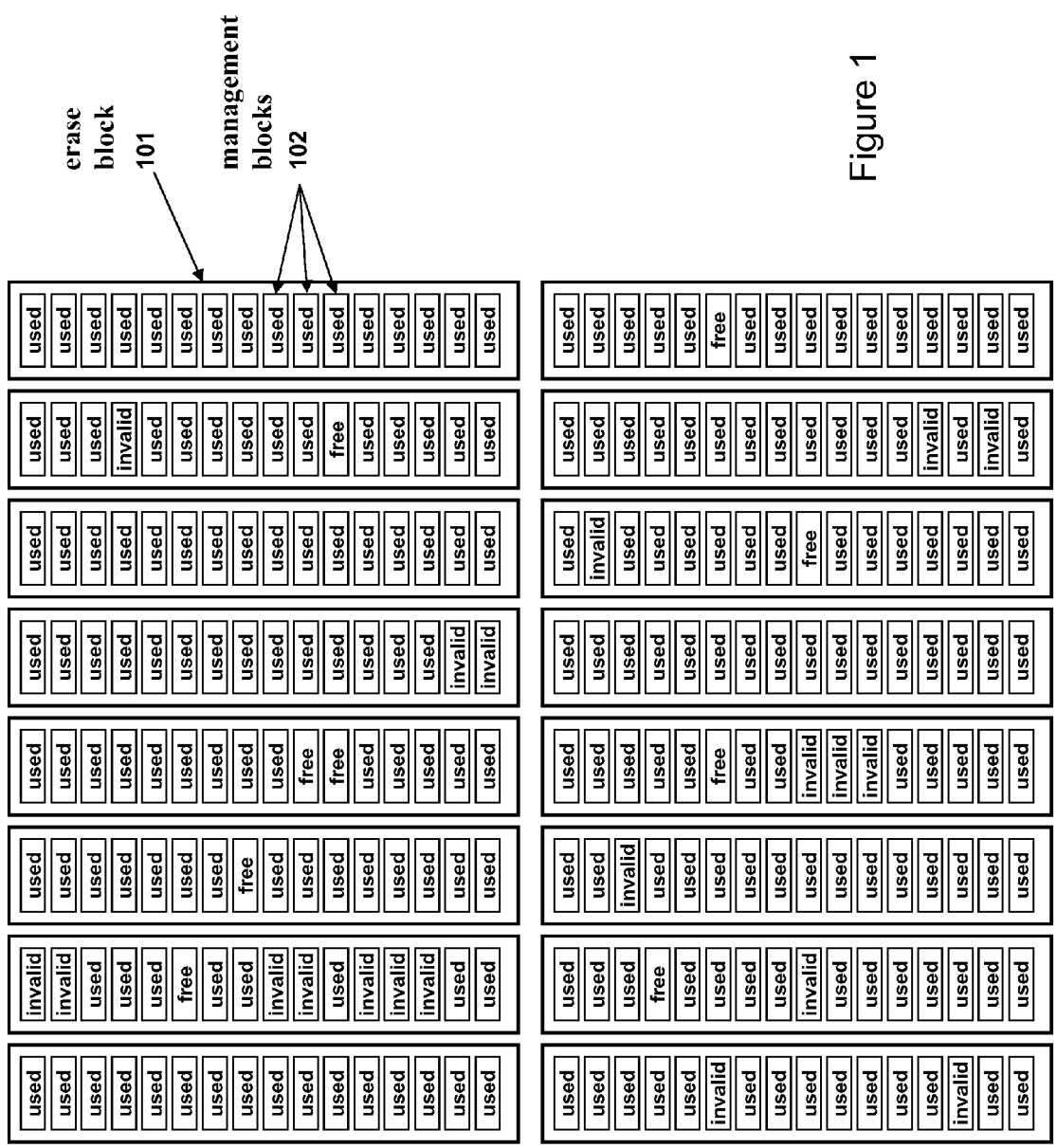
FIG. 1 illustrates a block diagram of an erase block of a mass storage device organized in management blocks, constructed according to an exemplary embodiment.

Turning now to FIG. 1, illustrated is a representative drawing of a portion of memory of a flash memory device identifying a representative erase block 101 among the many illustrated in the figure, and several representative management blocks 102 in an erase block 101. Management blocks are identified as used, invalid, or free. Management blocks containing (only) valid data are labeled "used," and management blocks containing old, now invalid data that have been previously copied and merged into used management blocks but not yet erased are identified as "invalid." Management blocks that have been erased and are now available for storage of new data are identified in the figure as "free." Most of the management blocks in the figure contain valid data, which is a frequent occurrence in many applications, and relatively few management blocks are shown as invalid or as free.

Instead of conventionally doing a copy, merge, and erase operation immediately when one or more management blocks of an erase block have been marked as invalid, a controller in an embodiment first identifies erase blocks containing a large number of management blocks marked as invalid. The advantage is that only the few remaining valid management blocks in such an erase block containing a substantial number of invalid management blocks must be copied and merged to render the entire erase block invalid and therefore prepared for an erase operation. This approach is particularly helpful if a reasonable number of erase blocks with lots of management blocks marked as invalid is likely to be found. This is a frequent occurrence as described below.

Since erase operations are mainly performed during idle times of the SSD, i.e., when data is not being actively stored into or read from the SSD by a host, it is necessary to keep a well-defined amount of blocks free for write operations to maintain a read/write speed of the SSD. When a host initiates a write operation, the SSD should not be required to start the erase procedure, and therefore delay the host's write operation.

The process can be further explained with a numerical example. An exemplary SSD comprising 256 GB of total storage area with a 4 kB page size, wherein a management block comprises 4 pages, has an erase block size of 64 pages. Thus, in this example there are 16 management blocks per erase block. In this exemplary SSD, $\frac{1}{32}$ of the entire storage area is reserved for management data, bad blocks, firmware, etc., $\frac{1}{32}$ of the entire storage area is to be kept as free blocks, and 1/16 of the entire storage area is reserved for invalid blocks. As a result, the remaining storage area for user data will be 7/8 (i.e., 1−1/32−1/32−1/16) of the entire storage area (where 1 GB=1024 MB=1024² kB=1024³ bytes).

Therefore, in this example there are a total of 64 M pages, 16 M management blocks (each of 4 pages), and 1 M erase blocks (each of 64 pages). Accordingly, 1 M invalid management blocks are distributed over 15 M management blocks (about 960 k erase blocks). As the invalid management blocks are distributed randomly over the storage area, the probability that a management block is marked as invalid is 1/15. The probability "p" of an erase block of 16 management blocks (of which, on the average, one management block is reserved collectively for management data, bad blocks, firmware, and free blocks) having "k" management blocks marked invalid can be calculated with equation (1):

$$p = \left(\frac{1}{15}\right)^k \cdot \left(\frac{14}{15}\right)^{16-k} \cdot \binom{16}{k} \quad (1)$$

where the notation $$\binom{16}{k}$$

represents the combinatorial function $16!/\{[k!] \cdot [(16-k)!]\}$.

Table I below shows the probabilities for different values of k from 0 to 16, and also the expected number of erase blocks among the 960 k total erase blocks. More precisely, in Table I the "Number of Erase Blocks" is calculated (with numerical rounding, of course) as $(1024)^2 \cdot (15/16) \cdot p(k)$. The column "Gain" is the ratio of the number k of management blocks containing invalid data in an erase block that become free per copy and merge operation on one management block during the erase procedure to the number 16-k of management blocks containing valid data that must be merged into the new erase block. Thus, the number Gain is k/(16-k). It can be seen from Table I that it is advantageous to perform a copy and merge operation on an erase block containing a large number of invalid management blocks, i.e., the "Gain" is large. It can also be seen from Table I that it is statistically very unlikely that a particular erase block will contain a substantial number of invalid management blocks.

TABLE I

| k | p (k) | Number of Erase Blocks | Gain |
|---|---|---|---|
| 0 | 3.3158010E−01 | 325956 | 0 |
| 1 | 3.7894870E−01 | 372522 | 0.0667 |
| 2 | 2.0300820E−01 | 199565 | 0.1429 |
| 3 | 6.7669400E−02 | 66522 | 0.2308 |
| 4 | 1.5708970E−02 | 15443 | 0.3333 |
| 5 | 2.6929660E−03 | 2647 | 0.4545 |
| 6 | 3.5265030E−04 | 347 | 0.6000 |
| 7 | 3.5984730E−05 | 35 | 0.7778 |
| 8 | 2.8916300E−06 | 3 | 1.0000 |
| 9 | 1.8359550E−07 | 0 | 1.2857 |
| 10 | 9.1797770E−09 | 0 | 1.6667 |
| 11 | 3.5765370E−10 | 0 | 2.2000 |
| 12 | 1.0644450E−11 | 0 | 3.0000 |
| 13 | 2.3394400E−13 | 0 | 4.3333 |
| 14 | 3.5807760E−15 | 0 | 7.0000 |
| 15 | 3.4102630E−17 | 0 | 15.000 |
| 16 | 1.5224390E−19 | 0 | ∞ |

Statistically, there are good erase block candidates for the erase procedure when a substantial number of management blocks are already marked as invalid. Considering that a lot of data in an SSD is often static data stored sequentially, the erase blocks containing this data do not generally contain invalid management blocks. Assuming that out of the 14 M management blocks, 7 M management blocks in entire erase blocks are filled with static data (i.e., 458,752 erase blocks are static, with k=0), the probabilities change slightly, since now the probability that a management block is marked as invalid is equal to 1/8:

$$p = \left(\frac{1}{8}\right)^k \cdot \left(\frac{7}{8}\right)^{(16-k)} \cdot \binom{16}{k}. \quad (2)$$

The results are illustrated in Table II below.

TABLE II

| k | p (k) | Number of Erase Blocks | Gain |
|---|---|---|---|
| 0 | 1.180671E−01 | 462855 | 0 |
| 1 | 2.698676E−01 | 159174 | 0.0667 |
| 2 | 2.891439E−01 | 170544 | 0.1429 |
| 3 | 1.927626E−01 | 113696 | 0.2308 |
| 4 | 8.949692E−02 | 52787 | 0.3333 |
| 5 | 3.068466E−02 | 18099 | 0.4545 |
| 6 | 8.036458E−03 | 4740 | 0.6000 |
| 7 | 1.640093E−03 | 967 | 0.7778 |
| 8 | 2.635864E−04 | 155 | 1.0000 |
| 9 | 3.347129E−05 | 20 | 1.2857 |
| 10 | 3.347129E−06 | 2 | 1.6667 |
| 11 | 2.608153E−07 | 0 | 2.2000 |
| 12 | 1.552472E−08 | 0 | 3.0000 |
| 13 | 6.824052E−10 | 0 | 4.3333 |
| 14 | 2.088996E−11 | 0 | 7.0000 |
| 15 | 3.979039E−13 | 0 | 15.000 |
| 16 | 3.552714E−15 | 0 | ∞ |

A management table is constructed in an embodiment that identifies the number of invalid management blocks in each erase block. Instead of initiating an erase operation for an erase block after marking the first management blocks as invalid, it is more effective to keep an amount of storage area reserved for invalid blocks, waiting before starting the erase operation, and having a management table listing the number of invalid management blocks in erase blocks. The management table can identify erase block candidates that already contain a substantial number of management blocks marked invalid. An erase operation is performed on erase blocks containing at least a number k of invalid management blocks. Thus, an erase operation is performed on erase blocks containing the most invalid management blocks. The erase operation can be continued until a fixed amount of management blocks in the erase blocks is free for storage of new data. Alternatively, an erase operation can be performed on erase blocks until all erase blocks containing a number k or larger of invalid management blocks have been copied and merged and then erased, rendering management blocks free for storage of new data. A combination of these erase operations may also be performed. The larger the amount of storage area reserved for invalid blocks and the larger the amount of static data, the more effective is the erase procedure as introduced herein.

Figure 2:
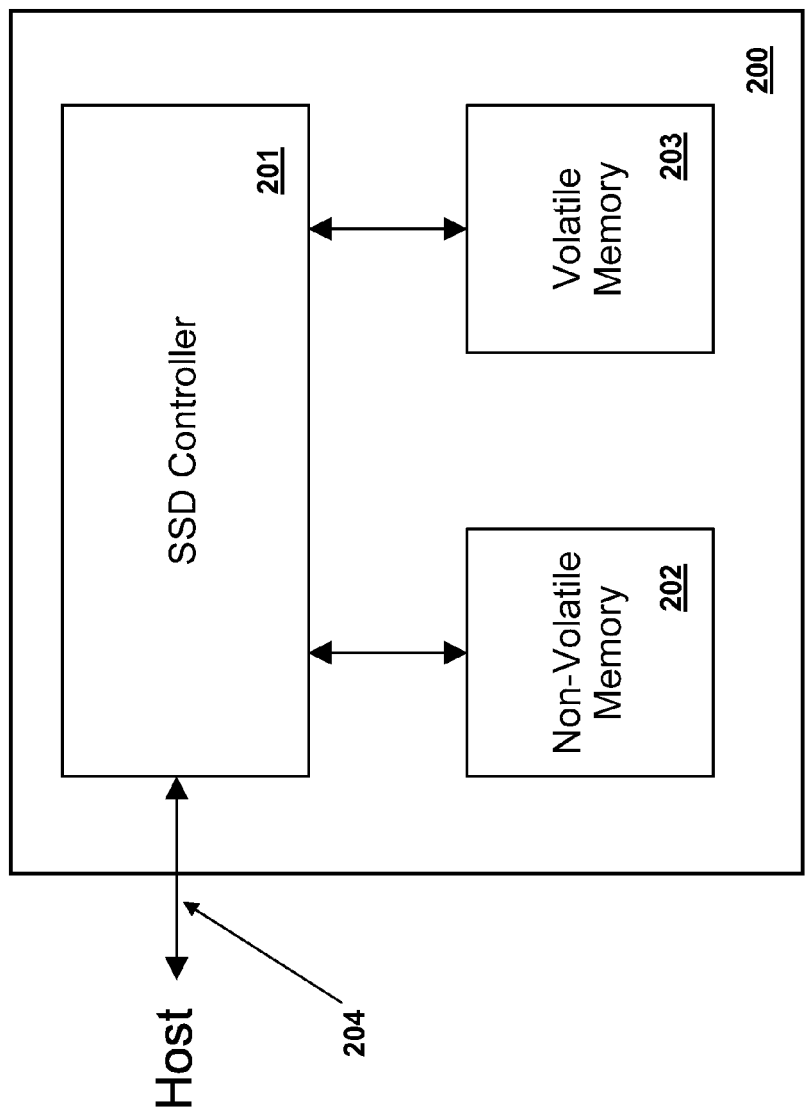
FIG. 2 illustrates a block diagram of a mass storage device including volatile and nonvolatile memory coupled to a controller, constructed according to an exemplary embodiment.

Turning now to FIG. 2, illustrated is a representative block diagram of a mass storage device 200, constructed according to an embodiment. The mass storage device includes non-volatile memory 202 coupled through a line 204 to a host, such as a host computer (not shown), and an SSD controller 201. The line 204 may include a plurality of conductors to complete a powering circuit to the mass storage device from the host computer. The mass storage device further includes a volatile memory 203 such as an SDRAM coupled to the controller 201. The volatile memory 203 represents a memory that can generally be easily overwritten, such as one word at a time, for housekeeping and temporary data storage functions. A battery may be included in the mass storage device to protect the volatile memory 302 during periods of absence of power from the host computer. For example, if the power source for the host computer is disabled, or if the mass storage device is improperly disconnected from the host computer, the controller 201 can utilize the battery to provide power to the mass storage device so that data can be transferred from the volatile memory to the nonvolatile memory. In this manner, sensitive data contained in the volatile memory can be protected in the event of loss of power from the host computer. The SSD controller includes the general functions of a microprocessor and manages the operations of the SSD memory device.

The concept has thus been introduced of constructing a mass storage device with a nonvolatile memory device, wherein a nonvolatile memory device such as a flash memory device includes a plurality of erase blocks, and each erase block is formed into memory management blocks. A controller is coupled to the nonvolatile memory device. In an embodiment, the controller is configured to identify an erase block in the nonvolatile memory device containing at least a number k of management blocks marked invalid, to copy and merge data from the erase block containing at least the number k of management blocks marked invalid, to store the merged data in a new management block, and to erase the erase block containing at least the number k of management blocks marked invalid. Preferably, the new management block is located in an erase block different from the identified erase block.

In an embodiment, the controller is further configured to erase additional erase blocks containing at least a number k of management blocks marked invalid until an amount of management blocks in the erase blocks in the mass storage device is free. In an embodiment, the controller is further configured to erase all erase blocks in the mass storage device containing at least a number k of management blocks marked invalid. In an embodiment, the controller is further configured to limit identification of the erase block containing at least the number k of management blocks marked invalid to the erase block in the mass storage device containing the largest number of management blocks marked invalid. Of course, the number k can assume the value one, wherein the controller just identifies the erase block (or blocks) containing the largest number of management blocks marked invalid. If more than one management block contains the largest number of management blocks marked invalid, the controller can select one of them, or more than one of them.

The controller may include a management table listing the number of invalid management blocks in erase blocks in the mass storage device. The management table may be stored in a volatile memory device coupled to the controller.

The number k may be adjusted to maintain a number of free management blocks. For example, if the number of free management blocks grows or shrinks over a number of memory read or write cycles, the number k may be incremented or decremented in proportion to a desired change in the number of free management blocks. Preferably, the number k is limited to a predetermined range. In an embodiment, identifying the erase block in the nonvolatile memory device, copying and merging the data from the erase block, and erasing the erase block containing at least the number k of management blocks marked invalid is preferably performed when data is not being stored into or read from the mass storage device by a host.

Another exemplary embodiment provides a method of constructing a mass storage device. In an embodiment, the method includes constructing the mass storage device with a nonvolatile memory device formed with a plurality of erase blocks. The method includes partitioning the erase blocks into memory management blocks, marking memory management blocks that contain data that has changed as invalid, identifying an erase block in the nonvolatile memory device containing at least a number k of management blocks marked invalid, copying valid data from the erase block containing at least the number k of management blocks marked invalid, merging the copied valid data into a list of data, storing the list of data in a new management block, and erasing the erase block containing at least the number k of management blocks marked invalid. In an embodiment, the method further includes forming the list of data as a sequential list.

In an embodiment, the method further includes determining an amount of management blocks in the erase blocks in the mass storage device that is free, and if the amount of management blocks in the mass storage device determined as free is less than a desired amount, then identifying a further erase block in the nonvolatile memory device containing at least the number k of management blocks marked invalid, copying valid data from the further erase block, merging the copied valid data from the further erase block into the list of data, storing the list of data in a new management block, and erasing the further erase block containing at least the number k of management blocks marked invalid.

In an embodiment, identifying an erase block in the nonvolatile memory device containing at least a number k of management blocks marked invalid further includes limiting the identification to an erase block in the mass storage device containing the largest number of management blocks marked invalid.

In an embodiment, the method further includes forming a management table listing the number of invalid management blocks in erase blocks in the mass storage device. Preferably, the method includes storing the management table in a volatile memory device coupled to the controller. In an embodiment, the new management block is stored in an erase block different from the identified erase block.

In an embodiment, the method further includes adjusting the number k to maintain a number of free management blocks in the mass storage device. For example, if the number of free management blocks grows or shrinks over a number of memory read or write cycles, the method includes incrementing or decrementing the number k in proportion to a desired change in the number of free management blocks. In an embodiment, the method further includes limiting the number k to a predetermined range.

In an embodiment, the method further includes determining when data is not being actively stored into or read from the mass storage device by a host, and if so, then determining an amount of management blocks in the erase blocks in the mass storage device that is free, and if the amount of management blocks in the mass storage device determined as free is less than a desired amount, then identifying an erase block in the nonvolatile memory device containing at least the number k of management blocks marked invalid, copying valid data from the erase block, merging the copied valid data from the erase block into the list of data, storing the list of data in a new management block, and erasing the erase block containing at least the number k of management blocks marked invalid.

Although a mass storage device and related methods has been described for application to digital data systems such as a host computer, it should be understood that other applications of a mass storage device, such as cellular telephony and photographic systems, are contemplated within the broad scope of the invention and need not be limited to digital data system applications.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A mass storage device, comprising:
a nonvolatile memory device comprising a plurality of erase blocks, each erase block comprising memory management blocks; and
a controller coupled to the nonvolatile memory device, wherein the controller is configured
to identify an erase block in the nonvolatile memory device containing at least a number k of management blocks marked invalid,
to copy and merge data from the erase block containing at least the number k of management blocks marked invalid, and to store the merged data in a new management block,
to erase the erase block containing at least the number k of management blocks marked invalid, and
to limit identification of the erase block containing at least the number k of management blocks marked invalid to the erase block in the mass storage device containing a largest number of management blocks marked invalid.

2. The mass storage device as claimed in claim 1, wherein the controller is further configured to erase additional erase blocks containing at least the number k of management blocks marked invalid until an amount of management blocks in the erase blocks in the mass storage device is free.

3. The mass storage device as claimed in claim 1, wherein the controller is further configured to erase all erase blocks in the mass storage device containing at least the number k of management blocks marked invalid.

4. The mass storage device as claimed in claim 1, wherein the controller comprises a management table listing the number of invalid management blocks in erase blocks in the mass storage device.

5. The mass storage device as claimed in claim 4, wherein the management table is stored in a volatile memory device coupled to the controller.

6. The mass storage device as claimed in claim 1, wherein the new management block is located in an erase block different from the identified erase block.

7. The mass storage device as claimed in claim 1, where in the number k is adjusted to maintain a number of free management blocks.

8. The mass storage device as claimed in claim 7, wherein the number k is limited to a predetermined range.

9. The mass storage device as claimed in claim 1, wherein identifying the erase block in the nonvolatile memory device, copying and merging the data from the erase block, and erasing the erase block containing at least the number k of management blocks marked invalid is performed when data is not being stored into or read from the mass storage device by a host.

10. A method of constructing a mass storage device, the method comprising:
providing a nonvolatile memory device comprising a plurality of erase blocks;
partitioning the erase blocks into memory management blocks;
marking memory management blocks that contain data that has changed as invalid;
identifying an erase block in the nonvolatile memory device containing at least a number k of management blocks marked invalid, wherein identifying the erase block in the nonvolatile memory device containing at least the number k of management blocks marked invalid further comprises limiting the identification to an erase block in the mass storage device containing a largest number of management blocks marked invalid;
copying valid data from the erase block containing at least the number k of management blocks marked invalid;
merging the copied valid data into a list of data;
storing the list of data in a new management block; and
erasing the erase block containing at least the number k of management blocks marked invalid.

11. The method as claimed in claim 10, further comprising forming the list of data as a sequential list.

12. The method as claimed in claim 10, further comprising:
determining an amount of management blocks in the erase blocks in the mass storage device that is free; and
if the amount of management blocks in the mass storage device determined as free is less than a desired amount, then
identifying a further erase block in the nonvolatile memory device containing at least the number k of management blocks marked invalid,
copying valid data from the further erase block,
merging the copied valid data from the further erase block into the list of data,
storing the list of data in a new management block, and
erasing the further erase block containing at least the number k of management blocks marked invalid.

13. The method as claimed in claim 10, further comprising forming a management table listing the number of invalid management blocks in erase blocks in the mass storage device.

14. The method as claimed in claim 13, further comprising storing the management table in a volatile memory device.

15. The method as claimed in claim 10, wherein the new management block is stored in an erase block different from the identified erase block.

16. The method as claimed in claim 10, further comprising adjusting the number k to maintain a number of free management blocks.

17. The method as claimed in claim 10, further comprising limiting the number k to a predetermined range.

18. The method as claimed in claim 10, wherein determining an amount of management blocks in the erase blocks in the mass storage device as free, and if the amount of management blocks in the mass storage device determined as free is less than a desired amount, then
identifying a further erase block in the nonvolatile memory device containing at least the number k of management blocks marked invalid,
copying valid data from the further erase block,
merging the copied valid data from the further erase block into the list of data,
storing the list of data in a new management block, and
erasing the further erase block containing at least the number k of management blocks marked invalid is performed when data is not being stored into or read from the mass storage device by a host.

* * * * *